United States Patent
Telles et al.

(10) Patent No.: US 11,486,921 B2
(45) Date of Patent: Nov. 1, 2022

(54) PROTECTION ADAPTER FOR OSCILLOSCOPE PROBES

(71) Applicant: International Business Machines Corporation, Armonk, NY (US)

(72) Inventors: Felipe Ferraz Telles, Germantown, NY (US); Mark Sobierajski, Pound Ridge, NY (US); Hubertus Franke, Cortlandt Manor, NY (US); Rajiv Joshi, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 341 days.

(21) Appl. No.: 16/839,783

(22) Filed: Apr. 3, 2020

(65) Prior Publication Data
US 2021/0311108 A1  Oct. 7, 2021

(51) Int. Cl.
*G01R 31/00* (2006.01)
*G01R 31/28* (2006.01)

(52) U.S. Cl.
CPC ................................ *G01R 31/2837* (2013.01)

(58) Field of Classification Search
CPC ............ G01R 1/06766; G01R 1/06788; G01R 1/06772; G01R 1/06794; G01R 1/36; G01R 1/24; G01R 1/206; G01R 1/073; G01R 31/2837; G01R 31/2834; G01R 31/2844; G01R 31/31905; G01R 31/31932; G01R 13/0218
See application file for complete search history.

(56) References Cited

U.S. PATENT DOCUMENTS

| | | | |
|---|---|---|---|
| 5,801,912 A | 9/1998 | Gershen et al. | |
| 6,587,319 B1 | 7/2003 | Finlay, Sr. | |
| 6,731,104 B1 | 5/2004 | Yang | |
| 7,049,911 B2 | 5/2006 | Germain et al. | |
| 9,559,515 B2 | 1/2017 | Frangen | |
| 10,041,975 B2* | 8/2018 | Knierim | G01R 31/50 |
| 10,976,377 B2* | 4/2021 | Biggs | G01R 27/2605 |
| 2005/0264427 A1 | 12/2005 | Zeng et al. | |
| 2010/0013503 A1* | 1/2010 | Huebner | G01R 31/31926 324/757.03 |

(Continued)

OTHER PUBLICATIONS

Franey, J. P., et al., "Field-Induced ESD from CRT's: Its Cause and Cure", IEEE Transactions on Components, Packaging, and Manufacturing Technology—Part A, Jun. 1995, pp. 280-283, vol. 18, No. 2.

(Continued)

*Primary Examiner* — Thang X Le
(74) *Attorney, Agent, or Firm* — Scully, Scott, Murphy & Presser, P.C.; Daniel P. Morris

(57) ABSTRACT

Systems and methods for monitoring current anomaly are described. In an example, a device can measure first current flowing along a first liner between an instrument to an equipment. The device can measure second current flowing along a second line between the equipment to the instrument. The device can compare the measurements of the first current and the second current. The device can identify a presence of current anomaly based on the comparison of the measurements of the first and second currents. The device can, in response to the presence of the current anomaly, disconnect the instrument from the equipment.

19 Claims, 3 Drawing Sheets

(56) References Cited

U.S. PATENT DOCUMENTS

| | | | |
|---|---|---|---|
| 2011/0043233 A1* | 2/2011 | Arkin | G01R 31/2889 |
| | | | 324/755.03 |
| 2014/0139961 A1 | 5/2014 | Mellon, Jr. et al. | |
| 2018/0278043 A1* | 9/2018 | Chen | G01R 1/36 |
| 2020/0284822 A1* | 9/2020 | Whittington | G01R 13/20 |
| 2021/0172977 A1* | 6/2021 | Holtz | H01B 9/04 |

OTHER PUBLICATIONS

Davis, N., "An Introduction to Oscilloscope Probes," https://www.allaboutcircuits.com/technical-articles/an-introduction-to-oscilloscope-probes/, Downloaded from the Internet, Oct. 23, 2019.

* cited by examiner

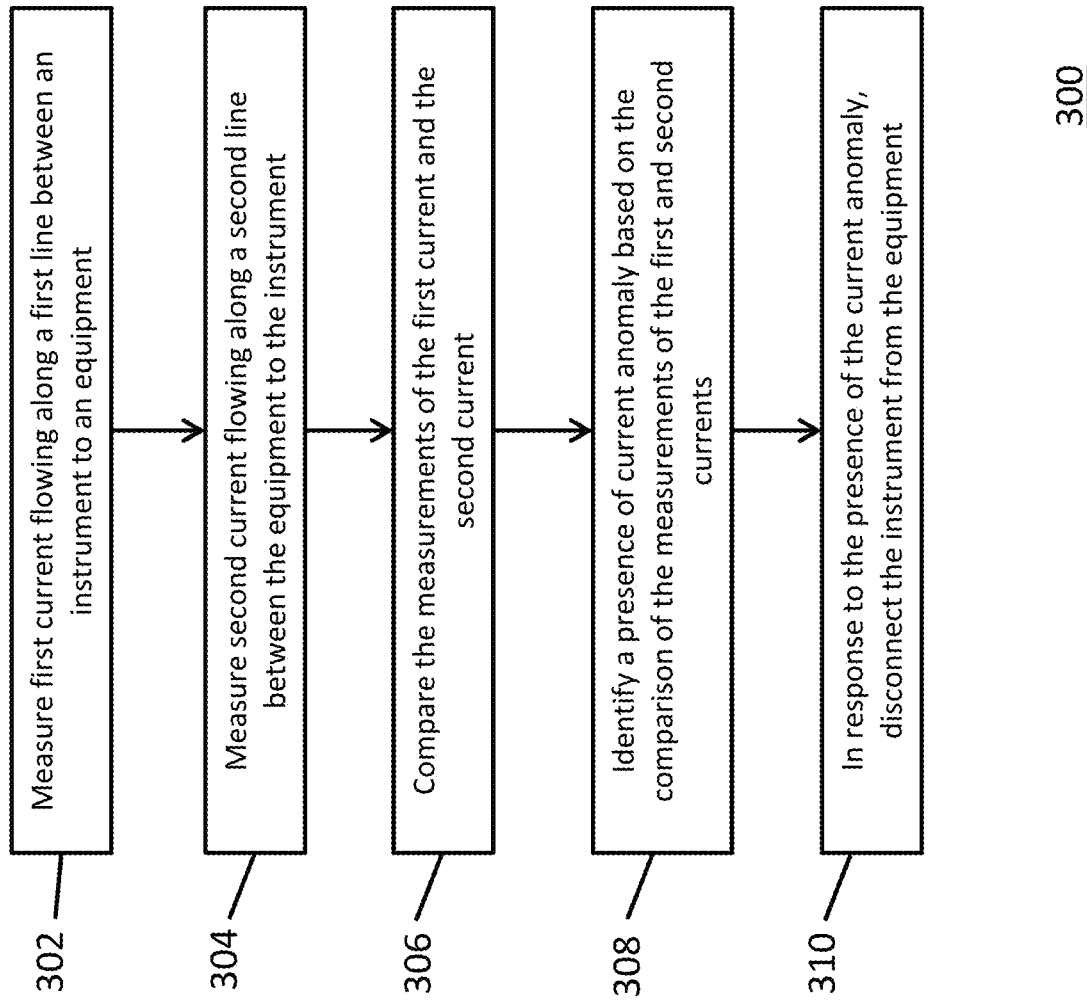

PROTECTION ADAPTER FOR OSCILLOSCOPE PROBES

BACKGROUND

The present disclosure relates in general to safety mechanisms for test equipments.

Test equipments, such as oscilloscopes, can be used for testing and measuring various attributes of a device under test (DUT) or unit under test (UUT). In an example, an oscilloscope's chassis can be connected to a ground terminal (or "ground"). In some examples, the oscilloscope can be in a floating position when measuring potential differences between two points that are not connected to ground. The floating position can be a position in which the oscilloscope is disconnected from ground. In some examples, floating the oscilloscope can be performed by physically removing the oscilloscope's chassis from the ground connection or using an isolation transformer.

SUMMARY

In some examples, a system for monitoring current anomaly is described. The system can include a unit under test (UUT), an instrument, a device connected to the instrument, and an equipment connected to the first device. The equipment can be configured to receive measurements of the UUT from the instrument through the device. The device can be configured to detect current anomaly between the instrument and the equipment. The device can be further configured to, in response to detecting the current anomaly, disconnect the instrument from the equipment.

In some examples, a device for monitoring current anomaly is described. The device can include a first circuit and a second circuit. The first circuit can be configured to measure first current flowing between an instrument to an equipment. The first circuit can be further configured to transmit the measurement of the first current to the second circuit. The second circuit can be configured to measure second current flowing between the equipment to the instrument. The second circuit can be further configured to transmit the measurement of the second current to the first circuit. The second circuit can be further configured to receive the measurement of the first current from the first circuit. The first circuit can be further configured to receive the measurement of the second current from the second circuit. The first circuit can be further configured to, in response to presence of current anomaly between the measurements of the first and second currents, deactivate at least one switch among the first circuit to disconnect the instrument from the equipment. The second circuit can be further configured to, in response to presence of current anomaly between the measurements of the first and second currents, deactivate at least one switch among the second circuit to disconnect the instrument from the equipment.

In some examples, a method for monitoring current anomaly is described. The method can include measuring first current flowing between an instrument to an equipment. The method can further include measuring second current flowing between the equipment to the instrument. The method can further include comparing the measurements of the first current and the second current. The method can further include identifying a presence of current anomaly based on the comparison of the measurements of the first and second currents. The method can further include, in response to the presence of the current anomaly, disconnecting the instrument from the equipment.

Further features as well as the structure and operation of various embodiments are described in detail below with reference to the accompanying drawings. In the drawings, like reference numbers indicate identical or functionally similar elements.

BRIEF DESCRIPTION OF THE DRAWINGS

FIG. 3 is a flow diagram illustrating a method of implementing a protection adapter for oscilloscope probes in one embodiment of the present disclosure.

DETAILED DESCRIPTION

The oscilloscope's chassis can be a common connection point for all signals being applied to or supplied from the oscilloscope. The connection allows the oscilloscope to make measurements with respect to ground. By floating the oscilloscope, the oscilloscope's chassis can become energized to the potential of the unit under test (UUT) due to the disconnection from ground. An operator of the oscilloscope may experience hazardous situations, such as electrical shock, when the oscilloscope is in the floating position. The apparatuses and methods described herein can provide a safety mechanism that can be implemented with the oscilloscope to protect the operator from hazardous situations when the oscilloscope is in the floating position. The safety mechanism described herein can disconnect the probe of the oscilloscope from the oscilloscope's chassis in response to the operator making contact with the oscilloscope's chassis when the oscilloscope is in the floating position.

Figure 1A:
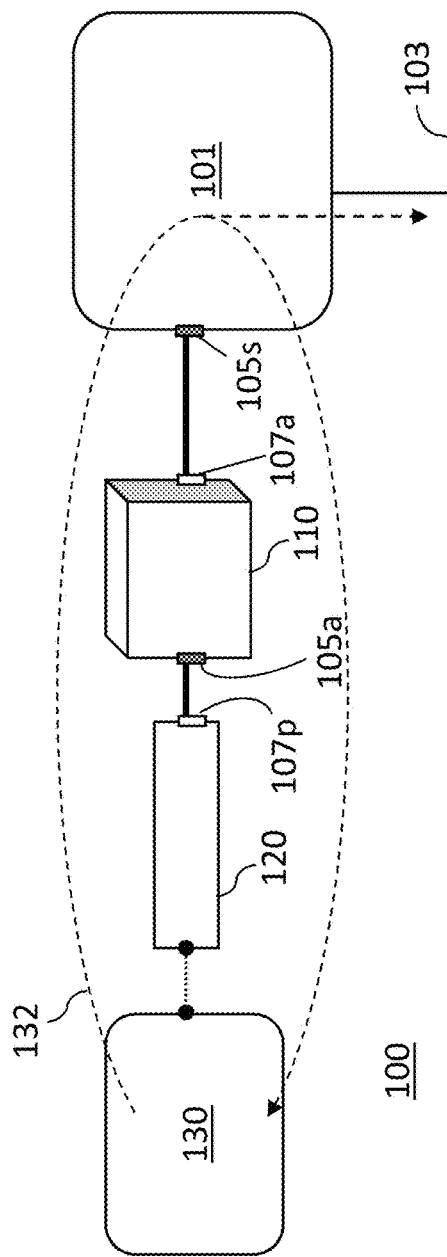
FIG. 1A is a diagram showing an example system that can implement a protection adapter for oscilloscope probes in one embodiment of the present disclosure.
Figure 1B:
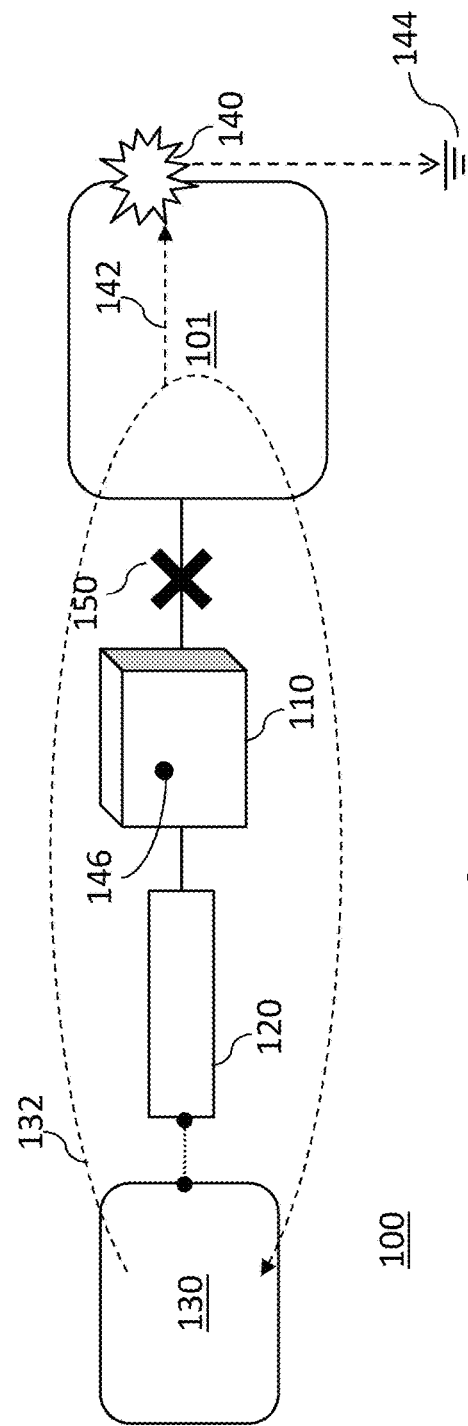
FIG. 1B is a diagram showing an example system that can implement a protection adapter for oscilloscope probes in one embodiment of the present disclosure.

FIGS. 1A and 1B are diagrams showing an example system or apparatus 100 that can implement a protection adapter for oscilloscope probes in one embodiment of the present disclosure. The system 100 can include an equipment 101, a device 110, an instrument 120, and a unit under test (UUT) 130. The equipment 101 can be a test equipment, such as a digital or an analog oscilloscope. The equipment 101 can be, for example, an oscilloscope configured to display waveforms representing electrical attributes of the UUT 130, where the electrical attributes can be measured by using the instrument 120. The instrument 120 can be a pair of probes that can be used by an operator of the equipment 101 to measure various electrical attributes of the UUT 130. The instrument 120 can be a pair of passive probes (e.g., having no active electronic parts, such as transistors, and does not require external power), or a pair of active probes (e.g., having active components, such as transistors, that may be required for operation). In an example embodiment, the device 110 can be an adapter integrated or embedded in the equipment 101. In another example embodiment, the device 110 can be an adapter that can be inserted between the equipment 101 and the instrument 120, and can be detachable from the equipment 101 and the instrument 120. The detachable embodiment can allow the device 110 to be compatible with different types and models of oscilloscopes.

The instrument 120 can include a connector 107p. The device 110 can include a connector 105a and a connector 107a. The equipment 101 can include a connector 105s. In an example embodiment, the instrument 120 can be connected to the equipment 101 by connecting the connector 107p to the connector 105s. To insert the device 110 between the instrument 120 and the equipment 101, the connector 107a of the device 110 can be connected to the connector 105s of the device 110 and the connector 105a of the device 110 can be connected to the connector 107p. The connectors 107p, 105a, 107a, and 105s can be, for example, Bayonet Neill-Concelman (BNC) connectors, SubMiniature version A (SMA) connectors, or other types of connector interface that may be compatible with coaxial cables and the equipment 101. The connectors 105a and 105s can be the same type of connectors, and the connectors 107p and 107a can be the same type of connectors. For example, the connectors 107p and 107a can be connectors including a pin, and the connectors 105a and 105s can be connectors including a recess that can hold the pin of connectors 107a and 107s upon making a connection.

In an example embodiment shown in FIG. 1A, the equipment 101 can be in a non-floating position, such as being connected to a ground terminal or ground 103. The instrument 120 can contact the UUT 130 to perform an electrical measurement on the UUT 130. The contact between the instrument 120 and the UUT 130 can cause current to flow from the UUT 130 to the equipment 101. The current can reach the equipment 101, and can be distributed to the ground 103 and also return to the UUT 130, as shown by a path 132.

In another example embodiment shown in FIG. 1B, the equipment 101 can be in a floating position, where the equipment 101 is no longer connected to ground 103. When the equipment 101 is in the floating position, and when the instrument 120 (e.g., one or more probes) is in contact with the UUT 130, the equipment 101 can be energized to the potential of the UUT 130. In an example, an entity (e.g., an object or an operator of the equipment 101), that may be in contact with ground, can contact the equipment 101. Contacting the equipment 101 when the equipment 101 is in the floating position can create a current path that goes to ground. For example, as shown by FIG. 1B, an entity can contact the equipment 101 at a point 140, and a current path 142 can be created between the equipment 101 and a ground terminal 144, through the point 140. This new path can allow current along the path 132 to be distributed to the ground 144. If an operator contacts the equipment 101 at the point 140, the current along the path 132 can flow to the ground 144, through the point 140 (and the operator), exposing the operator contacting the point 140 to shock hazard.

The device 110 can be inserted between the instrument 120 and the equipment 101 to detect contacts (e.g., by an entity) with the equipment 101 (e.g., at the point 140). The device 110 can detect the entity contacting the equipment and in response, perform a disconnection 150 to disconnect the instrument 120 and the device 110 from the equipment 101. The device 110 can perform a measurement 146 to detect a current fault along the path 132. For example, the device 110 can determine a difference between the current flowing from the instrument 120 into the equipment 101, and the current flowing out from the equipment 101 towards the instrument 120. This difference between the currents can be a result of the creation of a new path 142 between the equipment and the point 140. If the difference exceeds a threshold, the device 110 can determine that there may be a presence of current anomaly, and perform the disconnection 150. In another example, current can flow from the UUT 130 to the equipment 101 through both probes (e.g., a first line and a second line) of the instrument 120, along the path 132 when the entity contacts the equipment 101 at the point 140. The entity contacting the point 140 can cause introduction of an additional path for the current flowing along the path 132. The current flowing through the two probes of the instrument 120 can be significantly different (e.g., a current fault) as a result of the creation of a new path 142 between the equipment and the point 140, and the measurement 146 performed by the device 110 can reflect this difference. In an example, the current difference causing the current fault condition being detected by the measurement 146 can be based on different circuit elements connected in series between the point 140 and the instrument 120, such as the probing and reference leads in passive or active probes of the instrument 120. The disconnection 150 can cause the current flow from the UUT 130 to be limited to a level that may not harm the entity contacting the equipment 101. For example, the current flow from the UUT 130 to the equipment can be limited to the total energy withstood (e.g., work done) to a relatively safe level by significantly decreasing the exposure time of shock hazard and keeping the oscilloscope disconnected indefinitely upon the disconnection 150.

Figure 2:
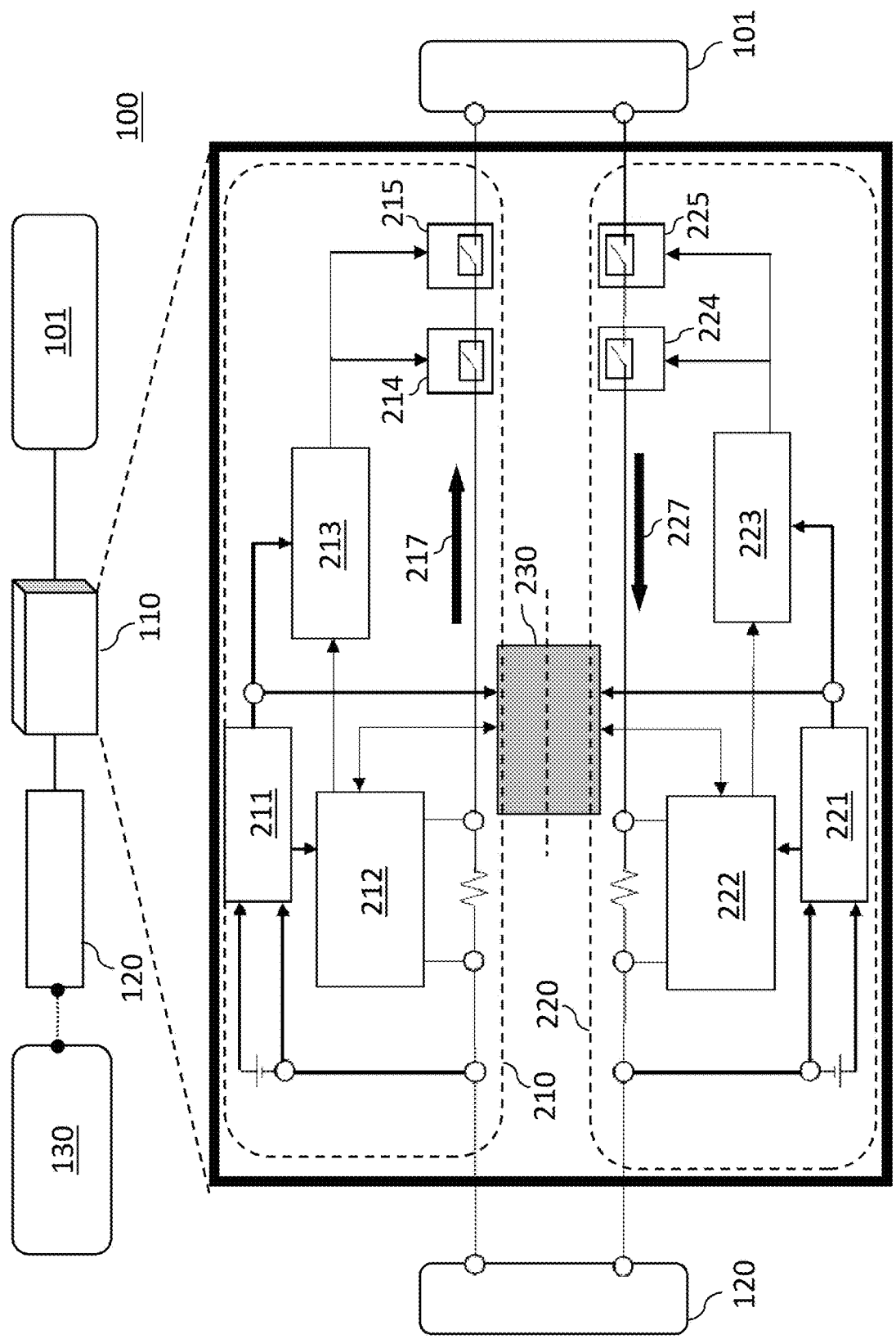
FIG. 2 is a diagram showing details of a protection adapter for oscilloscope probes in one embodiment of the present disclosure.

FIG. 2 is a diagram showing details of a protection adapter for oscilloscope probes in one embodiment of the present disclosure. The device 110 can include a first circuit 210 and a second circuit 220. The first circuit 210 can be connected to a first probe of the instrument 120 and the second circuit 220 can be connected to a second probe of the instrument 120. Current can flow between the instrument 120 and the equipment 101 via a first path or line that includes the first circuit 210 and via a second path or line that includes the second circuit 220. The first circuit 210 can include a power supply device 211, a microcontroller 212, a drive circuit 213, a switch 214, and a switch 215. The power supply device 211 can include a power source (e.g., a battery that can be inserted in the device 110) and a voltage regulator that can regulate supply being provided by the power source to the microcontroller 212, the drive circuit 213, and a device 230. The device 230 can be an opto-isolator. The microcontroller 212 can be configured to measure current flowing between the instrument 120 and the equipment 101. For example, the microcontroller 212 can measure current 217 flowing from the instrument 120 to the equipment 101. In some examples, the microcontroller 212 can be configured to measure current flowing between the instrument 120 and the equipment 101 in both directions (e.g., from instrument 120 to equipment 101, and from equipment 101 to instrument 120).

The second circuit 220 can include a power supply device 221, a microcontroller 222, a drive circuit 223, a switch 224, and a switch 225. The power supply device 221 can include a power source (e.g., a battery that can be inserted in the device 110) and a voltage regulator that can regulate supply being provided by the power source to the microcontroller 222, the drive circuit 223, and the device 230. In some examples, the power supply device 221 and the power supply device 211 can receive power from different power source (e.g., different batteries). By receiving power from different power source, the circuits 210 and 220 can operate at different voltages when the equipment 101 is being used to take measurements from the UUT 130. The microcontroller 222 can be configured to measure current flowing between the instrument 120 and the equipment 101. For example, the microcontroller 222 can measure current 227 flowing from the equipment 101 to the instrument 120. In some examples, the microcontroller 222 can be configured to measure current flowing between the instrument 120 and the equipment 101 in both directions (e.g., from instrument 120 to equipment 101, and from equipment 101 to instrument 120).

The microcontrollers 212 and 222 can exchange their respective current measurements. For example, the microcontroller 212 can transmit a measurement of the current 217 to the microcontroller 222. Similarly, the microcontroller 222 can transmit a measurement of the current 227 to the microcontroller 212. The exchange of the measurements can be performed using the device 230. The device 230 can be situated between an input/output (I/O) port of the microcontroller 212 and an I/O port of the microcontroller 222. The device 230 can be an opto-isolator configured to optically isolate the first circuit 210 and the second circuit 220. The optical isolation can provide a safe interface between the first circuit 210 and the second circuit 220 to communicate with each other in cases where the microcontrollers 210, 220 are operating under different voltages. For example, by being optically isolated, information such as current measurements can be exchanged between the first circuit 210 and the second circuit 220 using light, preventing electrical interference with other parts of the device 110.

By exchanging the measurements of the currents 217 and 227, both microcontrollers 212 and 222 can have possession of the measurements of the currents 217 and 227. The microcontrollers 212 and 222 can each compare the measurement of the currents 217 with the measurement of the current 227. The comparison of the measurements of currents 217, 227, can provide indication on whether fault current or current anomaly is present or not. For example, the microcontrollers 212 and 222 can each be configured to compare the difference between measurements of currents 217 and 227 with a current tripping threshold, where the current tripping threshold can be preset in a memory of the microcontrollers 212 and 222. The difference between the measurements of the currents 217 and 227 can indicate a current imbalance caused by a distribution of current towards the entity that contacted the equipment 101 when the equipment 101 is in the floating position.

Note that the example embodiment shown in FIG. 2 can be applicable to comparing measurements of currents flowing in opposite directions. The device 110 can also be configured to measure current flowing in the same directions, and perform the comparison described herein on the measured current flowing in the same direction. For example, during a fault condition, current can flow from the instrument 120 towards a single point (e.g., point 140) on the equipment 101 via both circuits 210 and 220. In such fault condition, the difference between the current flowing through the circuits 210 and 202 can be relatively significant. As mentioned above, the current difference causing the current fault condition being detected by the device 110 can be based on different circuit elements connected in series between a contact point (e.g., point 140 shown in FIG. 1) and the instrument 120, such as the probing and reference leads in passive or active probes of the instrument 120.

In response to the difference between measurements of currents 217 and 227 being greater than the current tripping threshold, the microcontroller 212 can generate a signal (e.g., a low-power input signal) and transmit the generated signal to the drive circuit 213. The drive circuit 213 can receive the signal from the microcontroller 212 and in response, generate a drive signal to drive or actuate the switches 214, 215. In an example embodiment, the switch 214 can be a solid state switch and the switch 215 can be an electromechanical switch. The drive signal outputted by the drive circuit 213 can reach the switch 214 (the solid state switch) and the switch 215 (the electromechanical switch) at substantially the same time. In an example, a solid state switch may not include a physical component to perform the switching. A solid state switch can be activated (switched ON) by using the input control or drive signal to energize an output signal, and allow the energized output signal to pass through the switch's output. An electromechanical switch can use a physical moving part as a switch, where the input drive signal can move this physical moving part to toggle the electromechanical switch ON or OFF. The switch 214 can be actuated before the switch 215 based on a solid state switch having a faster response time and faster switching speed when compared to an electromechanical switch.

Similarly, in response to the difference between measurements of currents 217 and 227 being greater than the current tripping threshold, the microcontroller 222 can generate a signal (e.g., a low-power input signal) and transmit the generated signal to the drive circuit 223. The drive circuit 223 can receive the signal from the microcontroller 222 and in response, generate a drive signal to drive or actuate the switches 224, 225. The switch 224 can be a solid state switch and the switch 225 can be an electromechanical switch. The drive signal outputted by the drive circuit 223 can reach the switch 224 (the solid state switch) and the switch 225 (the electromechanical switch) at substantially the same time. The switch 224 can be actuated before the switch 225 based on a solid state switch having a faster response time and faster switching speed when compared to an electromechanical switch.

Based on the solid state switch (e.g., 214, 224) being actuated before the electromechanical switch (e.g., 215, 225), a duration of hazard exposure to the entity (e.g., an operator) contacting the equipment 101, in a floating position, can be reduced. This reduction can be a result of differences in response and switching times between a solid state switch and an electromechanical switch. For example, solid state switches can respond to control or drive signals in approximately 100 microseconds (μs) or less, whereas electromechanical switches can take up to 5 to 15 milliseconds (ms) to respond. The faster response time of the solid state switch can cause the duration reduction of hazard exposure to the entity.

Further, by having a solid state switch (e.g., 214, 224) in series with an electromechanical switch (e.g., 215, 225) in each circuit 210, 220, a reliability of disconnecting the instrument 120 from the equipment 101 can be improved when compared to using a single solid state switch. This improved reliability can be based on an electromechanical switch using a moving part that can be physically disengaged, whereas a solid state switch does not use a moving part. By having a moving part, no current can flow through the electromechanical switch when the electromechanical switch is deactivated or disengaged. In the example shown in FIG. 2, by having a solid state switch in series with an electromechanical switch, the device 110 can be disconnected from the instrument 120 and/or the equipment 101 quickly and reliably in response to a detection of fault current. Further, the disconnected instrument 120 and/or device 110 may need to be manually re-engaged or reconnected to the equipment 101 by re-activating the electromechanical switches 215, 225. Furthermore, by having both a solid state switch and an electromechanical switch in each circuit (e.g., first circuit 210 and second circuit 220), a reliability of disconnecting the instrument 120 from the equipment 101 can be improved in case either one of the two switches fails.

FIG. 3 is a flow diagram 300 illustrating a method of implementing a protection adapter for oscilloscope probes in one embodiment of the present disclosure. An example process may include one or more operations, actions, or functions as illustrated by one or more of blocks 302, 304, 306, 308, and/or 310. Although illustrated as discrete blocks, various blocks can be divided into additional blocks, combined into fewer blocks, eliminated, or performed in parallel, depending on the desired implementation.

The process 300 can begin at block 302. At block 302, a device can measure first current flowing along a first line between an instrument to an equipment. In some examples, the equipment is disconnected from ground. The equipment can be an oscilloscope and the instrument can be a pair of probes. The process 300 can continue from the block 302 to the block 304. At block 304, the device can measure second current flowing along second line between the equipment to the instrument. The process 300 can continue from the block 304 to the block 306. At block 306, the device can compare the measurements of the first current and the second current. The process 300 can continue from the block 306 to the block 308. At block 308, the device can identify a presence of current anomaly based on the comparison of the measurements of the first and second currents. In some examples, the current anomaly can indicate a current imbalance between the first current and the second current. The process 300 can continue from the block 308 to the block 310. At block 310, the device can, in response to the presence of the current anomaly, disconnect the instrument from the equipment.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements, if any, in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A system comprising:
   a unit under test (UUT);
   an instrument;
   a device connected to the instrument;
   an equipment connected to the first device, the equipment being configured to receive measurements of the UUT from the instrument through the device;
   the device being configured to:
     detect current anomaly between the instrument and the equipment, wherein the current anomaly indicates a current imbalance between first current flowing along a first line from the instrument to the equipment and second current flowing along a second line from the equipment to the instrument; and
     in response to detecting the current anomaly, disconnect the instrument from the equipment.

2. The system of claim 1, wherein the equipment is disconnected from ground.

3. The system of claim 1, wherein the device is integrated in the equipment.

4. The system of claim 1, wherein the equipment is an oscilloscope and the instrument is a pair of probes.

5. A device comprising:
   a first circuit; and
   a second circuit;
   the first circuit being configured to:
     measure first current flowing along a first line between an instrument to an equipment;
     transmit the measurement of the first current to the second circuit;
   the second circuit being configured to:
     measure second current flowing along a second line between the equipment to the instrument;
     transmit the measurement of the second current to the first circuit;
     receive the measurement of the first current from the first circuit;
   the first circuit being further configured to receive the measurement of the second current from the second circuit; and
   in response to presence of current anomaly between the measurements of the first and second currents:
     the first circuit is configured to deactivate at least one switch among the first circuit to disconnect the instrument from the equipment; and
     the second circuit is configured to deactivate at least one switch among the second circuit to disconnect the instrument from the equipment.

6. The device of claim 5, wherein the current anomaly indicates a current imbalance between measurements of the first current and the second current.

7. The device of claim 5, wherein:
   the first circuit is configured to:
     determine a difference between the measurements of the first and second currents; and determine the presence of the current anomaly based on the determined difference;
the second circuit is configured to:
determine the difference between the measurements of the first and second currents; and
determine the presence of the current anomaly based on the determined difference.

8. The device of claim 5, wherein the first circuit and the second circuit are optically isolated.

9. The device of claim 5, further comprises:
a first power source configured to power the first circuit; and
a second power source configured to power the second circuit.

10. The device of claim 5, wherein:
the at least one switch among the first circuit comprises a first solid state switch and a first electromechanical switch; and
the at least one switch among the second circuit comprises a second solid state switch and a second electromechanical switch.

11. The device of claim 5, wherein the equipment is disconnected from ground.

12. The device of claim 5, wherein:
the first circuit comprises:
a first drive circuit; and
a first microcontroller configured to:
perform the measurement of the first current and the transmission of the measurement of the first current to the second circuit; and
operate the first drive circuit to actuate the at least one switch among the first circuit;
the second circuit comprises:
a second drive circuit; and
a second microcontroller configured to:
perform the measurement of the second current and the transmission of the measurement of the second current to the first circuit; and
operate the second drive circuit to actuate the at least one switch among the second circuit.

13. The device of claim 5, wherein the equipment is an oscilloscope and the instrument is a pair of probes.

14. A method for monitoring current anomaly, the method comprising:
measuring first current flowing along a first line between an instrument to an equipment;
measuring second current flowing along a second line between the equipment to the instrument;
comparing the measurements of the first current and the second current;
identifying a presence of current anomaly based on the comparison of the measurements of the first and second currents; and
in response to the presence of the current anomaly, disconnecting the instrument from the equipment.

15. The method of claim 14, wherein the equipment is disconnected from ground.

16. The method of claim 14, wherein the current anomaly indicates a current imbalance between the first current and the second current.

17. The method of claim 14, further comprising:
determining a difference between the measurements of the first and second currents; and
comparing the difference with a threshold; and
identifying the presence of the current anomaly in response to the difference being greater than the threshold.

18. The method of claim 14, wherein the equipment is an oscilloscope and the instrument is a pair of probes.

19. The method of claim 14, wherein disconnecting the instrument from the equipment comprises deactivating at least one switch integrated in a device, the device being connected to the instrument and the equipment.

\* \* \* \* \*